United States Patent [19]

Litwin

[11] Patent Number: 5,432,377
[45] Date of Patent: Jul. 11, 1995

[54] DIELECTRICALLY ISOLATED SEMICONDUCTOR DEVICE AND A METHOD FOR ITS MANUFACTURE

[75] Inventor: Andrej Litwin, Danderyd, Sweden

[73] Assignee: Telefonaktiebolaget LM Ericsson, Stockholm, Sweden

[21] Appl. No.: 185,146

[22] Filed: Jan. 24, 1994

[30] Foreign Application Priority Data

Jan. 25, 1993 [SE] Sweden ................... 9300211

[51] Int. Cl.⁶ .................................................. H02L 27/04
[52] U.S. Cl. ................................ 257/506; 257/492; 257/493; 257/504; 257/524
[58] Field of Search ............... 257/134, 287, 504, 506, 257/327, 341, 343, 492, 493, 524–526

[56] References Cited

U.S. PATENT DOCUMENTS

| | | |
|---|---|---|
| 4,409,606 | 10/1983 | Wagenaar et al. . |
| 4,422,089 | 12/1983 | Vaes et al. . |
| 4,485,392 | 11/1984 | Singer . |
| 4,587,545 | 5/1986 | Berthold et al. . |
| 4,587,656 | 5/1986 | Hartman et al. . |
| 4,605,948 | 8/1986 | Martinelli . |
| 4,608,590 | 8/1986 | Hartman et al. . |
| 4,639,761 | 1/1987 | Singer et al. . |
| 4,691,220 | 9/1987 | Becke et al. ........... 257/234 |

FOREIGN PATENT DOCUMENTS

| | | |
|---|---|---|
| 086010 | 8/1983 | European Pat. Off. . |
| 391056 | 10/1990 | European Pat. Off. . |
| 418737 | 3/1991 | European Pat. Off. . |
| 2728532 | 8/1979 | Germany ................ 257/287 |
| 55-96677 | 7/1980 | Japan .................... 257/234 |

OTHER PUBLICATIONS

J. A. Appels et al., "High Voltage Thin Layer Devices (Resurf Devices)", *IEEE Proc. IEDM* 79, pp. 238–241 (1979).
J. A. Appels et al., "Thin Layer High-Voltage Devices (Resurf Devices)" *Philips Journal of Research*, vol. 35, No. 1, pp. 1–13 (1980).
H. W. Becke, "Approaches to Isolation in High Voltage Integrated Circuits" *IEDM 85*, pp. 724–727 (1985).
M. F. Chang et al., "Advanced 1200v HVIC Technology" *IEEE Proc. IEDM 86*, pp. 230–233 (1986).
A. W. Ludikhuize, "A Versatile 700–1200-V IC PRocess for Analog and Switching Applications" *IEEE Trans. on Electron Devices*, vol. 38, No. 7, pp. 1582–1589 (Jul. 1991).
S. M. Sze, *Physics of Semiconductor Devices*, Second Edition, pp. 312–324 John Wiley & Sons (1981).

Primary Examiner—J. Carroll
Attorney, Agent, or Firm—Burns, Doane, Swecker & Mathis

[57] ABSTRACT

A semiconductor device is supported by a semiconductor body which comprises a substrate, an oxide layer and a weakly doped monocrystalline wafer. Trenches for a dielectrically isolating layer which surrounds a component region are etched in the wafer. A field effect transistor in the component region has two doped wafer-line gate regions, which have been diffused in the component region with the aid of a first mask. Two heavily doped regions are diffused in the component region with the aid of a second mask, these regions forming the source region and the drain region of the transistor. The semiconductor body is easy to produce and is available commercially, which simplifies manufacture of the field effect transistor. Manufacture is also simplified because the configuration of both the component region and the parts of the transistor are determined by the simple choice of masks. The component region is weakly doped and is easy to deplete of charge carriers. The electrical field strength in the component region is weak, according to the RESURF method, and the field effect transistor withstands high voltages without risk of current breakthrough. The component region occupies only a relatively small area on the substrate.

5 Claims, 8 Drawing Sheets

DIELECTRICALLY ISOLATED SEMICONDUCTOR DEVICE AND A METHOD FOR ITS MANUFACTURE

BACKGROUND

The present invention relates to a dielectrically isolated semiconductor device which has charge carrier depleted regions of reduced electrical field strength and which comprises a semiconductor body:

a component region in the semiconductor body with an upper surface;

a dielectrically isolating layer which delimits the component region from the semiconductor body;

a sunken region in the component region, this sunken region extending from the upper surface of the component region and down thereinto;

a PN-junction at the delimiting surface of the sunken region which surface delimits said region from a remaining part of the component region, said part having an opposite type of doping to the type of doping of the sunken region; and a semiconductor component in the component region having at least one electrical connection region in each of the sunken region and the remaining part of the component region;

wherein the regions of reduced electrical field strength are depleted of charge carriers by electric voltages that are applied via the electrical connection regions; and a method for manufacturing the semiconductor device.

Semiconductor circuits are required to withstand a relatively high voltage in many different kinds of applications. An example of one such application is found in the subscriber line circuits of telephone exchanges. In older Swedish telephone exchanges, the line to a subscriber was required to have an applied voltage of 48 volts, and modern subscriber line circuits in semiconductor techniques are adapted to these voltages. Higher voltages are required in other countries, for instance 68 volts in Germany, while other applications of semiconductor circuits may use still higher voltages, for instance voltages of 400 volts or more.

One problem with these relatively high voltages is that the electrical field strength may exceed the critical field strength of the semiconductor material in certain regions of a component. This can result in a current breakthrough which destroys the semiconductor material if the current is not limited. The same problem of high field strength also occurs in very small and rapid semiconductor components intended for calculating or computing circuits. Although these components are connected to low voltages, in the order of 3 to 5 volts, the small extensions of the components enable the electrical field strength to reach high values.

In certain applications, the problem of high electric field strength is pronounced at the surface of a semiconductor component, as described in an article in IEEE, Proceedings from IEDM, 1979, pages 238–241, by J. A. Appels and H. M. J. Vaes: "High Voltage Thin Layer Devices (Resurf Devices)", this article being hereby incorporated by reference in the present description. The semiconductor component has a surface layer in which there is included a PN-junction in which the critical field strength of the material is reached at a given applied voltage. The surface layer is weakly doped on one side of the PN-junction and this weakly doped part can be depleted of charge carriers by making the surface layer relatively thin. The applied voltage is herewith distributed over a long distance along the component surface, so that the maximum field strength will adopt a value beneath the breakdown field strength. The phenomenon is well known within semiconductor technology and has been given the acronym RESURF (REduced SURface Field). The resurf technique is described in more detail in an article in Philips J. Res. 35, 1–13, 1980, J. A. Appels, et al: "Thin Layer High-Voltage Devices". This article is also incorporated by reference in the present description.

In addition to the aforesaid problem of current breakthrough in semiconductor components, the individual components mounted on a common semiconductor substrate influence one another in an undesirable manner. It is known to overcome this problem by isolating the components one from the other, for instance in the manner described in European Patent Application EP-A1-0,418,737. According to this prior publication, a semiconductor substrate is provided with an oxidized surface which forms an isolating layer on which a relatively thin wafer of monocrystalline semiconductor material is mounted. This monocrystalline wafer has etched therein grooves which extend down to the isolating layer and the side surfaces of the grooves are oxidized and the grooves filled with polycrystalline semiconductor material. Semiconductor components are formed in the dielectrically isolated box-like regions thus formed. These components have an external connection which is connected to a heavily doped connection layer beneath respective components on the bottoms of respective box-like regions, in direct abutment with the isolating oxide layer. A plurality of different types of components are shown, for instance field effect transistors and bipolar transistors.

The European Patent Application No. A2-0,391,056 describes an alternative method of forming a semiconductor substrate with dielectrically isolated regions. The isolated regions are produced by repeatedly etching the substrate and coating with semiconductor material. The dielectric isolation is comprised of oxidized semiconductor material. The regions have a weakly doped area in which the actual component is formed and a heavily doped connection layer which is located beneath said component and lies against the dielectrically isolating layer.

One type of component which often occurs is the so-called JFET (Junction Field Effect Transistor), described, for instance, in a textbook on semiconductor components written by S. M. Sze: "Physics of Semiconductor Devices", second edition chapters 6.1 and 6.2. The book is published by John Wiley & Sons, Inc., 1981. Field effect transistors JFET are produced in accordance with known techniques, by mounting individual semiconductor layers on top of one another and it is a relatively complicated process to produce these transistors in a dielectrically isolated region.

SUMMARY

According to one aspect, the present invention solves the problem of providing semiconductor components, for instance the aforesaid JFET transistor, which can be readily produced in the dielectrically isolated box-like component regions on a semiconductor substrate. The box-like component region has an electrically isolated bottom surface and is surrounded by the walls of the box which have the form of vertical dielectrically isolated layers. The component region is relatively weakly doped with a predetermined type of doping material, either positively or negatively. The component has two wafer-like subregions which extend along the isolating layers on two mutually opposing sides of the component region. These subregions are doped with a type of doping material which is opposite to the type of doping material used in the component region, so as to form a PN-junction between the component. The two wafer-like subregions may be mutually joined to form a continuous U-shaped region commonly doped with the same type of doping material. This continuous region is used for a plurality of different types of components or component combinations.

The wafer-like subregions and the connection therebetween are achieved by diffusion or implantation of doping material down into the component region, via the surface of said region. The thus doped regions can therefore be produced readily in the dielectrically isolated component region. The doped regions can also readily be given desired forms, simply by appropriate choice of the configuration of the mask used in the doping process.

Another aspect of the invention solves the problem of producing voltage durable components within the delimited, dielectrically isolated component region.

The components in the component region have electrical connections to which electrical voltages are applied. The aforesaid PN-junctions between the wafer-like subregions and the remainder of the component region are reverse-biassed with the aid of these voltages. This enables parts of the component region to be depleted of charge carriers in accordance with the aforesaid RESURF method, so that the voltage applied will be distributed over a large distance within the component region. The electrical field strength in the component region will therefore be low and can be maintained beneath a breakdown field strength for the semiconductor material. The component region and the wafer-like subregions contain a relatively low concentration of doping substances and can therefore readily be depleted of charge carriers.

BRIEF DESCRIPTION OF THE DRAWINGS

The invention will now be described in more detail with reference to exemplifying embodiments thereof and also with reference to the accompanying drawings, in which.

DETAILED DESCRIPTION

Figure 1:
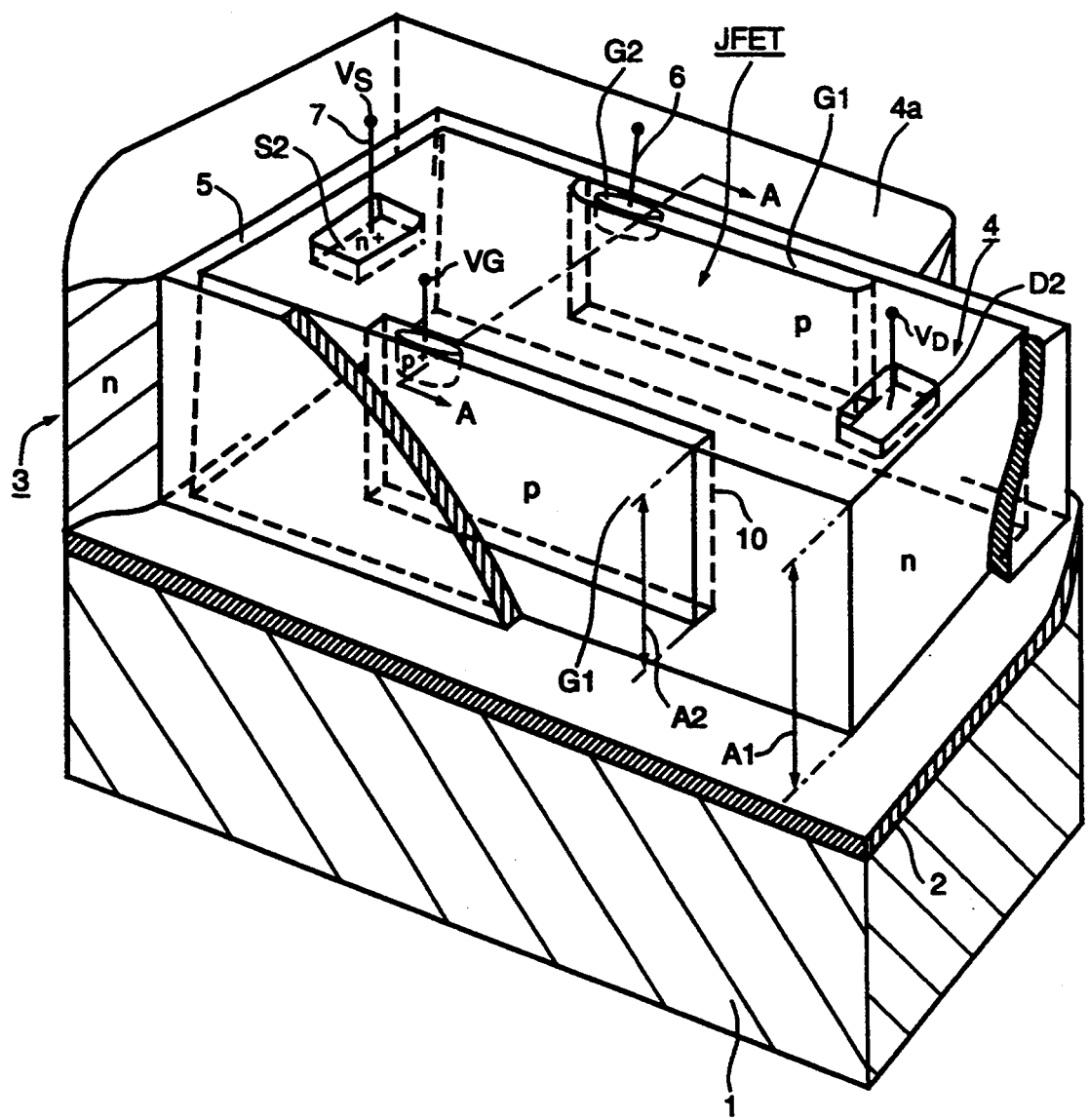
FIG. 1 is a perspective view of an inventive component.

FIG. 1 is a perspective view of an inventive semiconductor component, a field effect transistor JFET, which is partially exposed in the Figure. The upper surface of a semiconductor substrate 1, in this case a silicon substrate, is oxidized to form a dielectrically isolated layer 2 of silicon dioxide. Mounted on the layer 2 is a monocrystalline silicon wafer 3 having a relatively low concentration of negative charge carriers, designated n in the Figure. The monocrystalline wafer 3 has a thickness A1. In the case of the illustrated embodiment, A1=6 μm. The substrate 1, the layer 2 and the wafer 3 form a semiconductor body which carries an elongated component region 4. This component region is formed in the wafer 3 and is delimited from a surrounding region 4a by a dielectrically isolating layer 5 comprised of silicon dioxide and polycrystalline silicon. The isolating layer 5 extends from the surface of the monocrystalline wafer 3 down to the dielectrically isolating layer 2 and completely surrounds the component region 4 containing the junction field effect transistor JFET. The component region is thus a box-like semiconductor region which is completely isolated electrically against surrounding parts of the semiconductor body. For the sake of clarity, parts of the isolating layer 5 have been excluded from the Figure, as have also parts of the surrounding region 4a. The field effect transistor JFET includes a gate comprised of two wafer-like regions G1, which are doped with positive charge carriers designated p in the Figure. The wafer-like regions G1 are placed opposite one another midway of a respective long side of the component region 4 and lie against the dielectrically isolated layer 5. The regions G1 extend from the surface of the component region 4 downwardly in said region to a depth A2, in the illustrated case to a depth A2=4 μm. Each of the gate regions G1 has a respective heavily and positively p+-doped connection region G2 for an external electrical connection 6, which is only shown schematically for the sake of clarity. A PN-junction 10 is provided in a border region between the gate regions G1 and the remainder of the component region 4. One end of the component region 4 has a heavily and negatively n+-doped source region S2, and the other end of said region has a heavily n+-doped drain region D2 for the field effect transistor JFET. The source region S2 and the drain region D2 are electrical connection regions for the field effect transistor JFET and each has an external electrical connection 7, shown schematically in the Figure.

Figure 2:
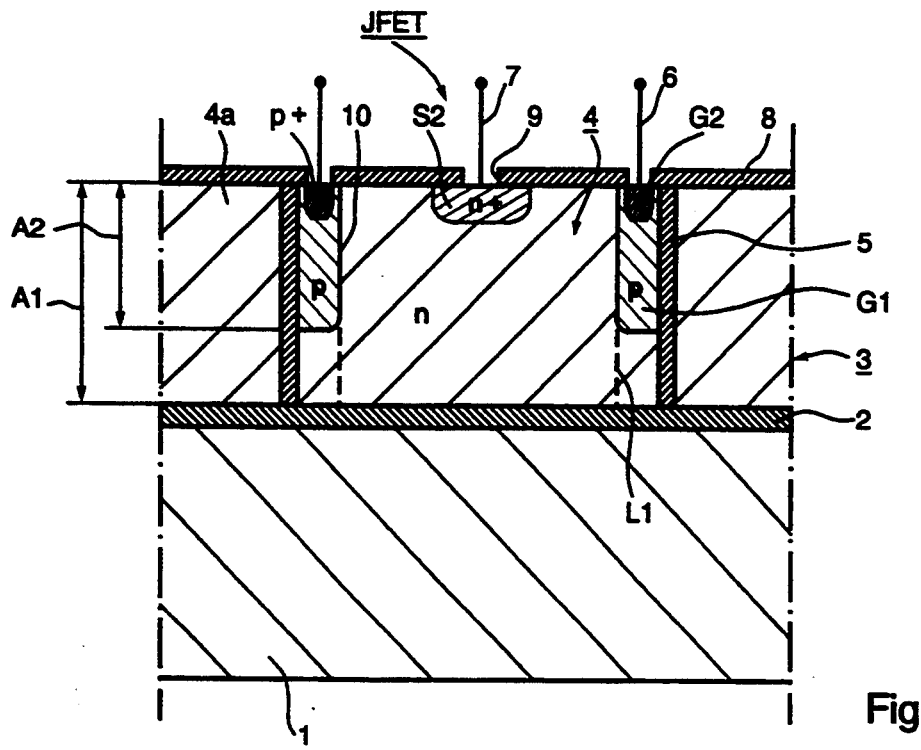
FIG. 2 is a cross-sectional view of the component shown in FIG. 1.

FIG. 2 is a cross-sectional view of the field effect transistor JFET, taken on the section line A—A in FIG. 1. The Figure illustrates the component region 4 with the two gate regions G1 in abutment with the dielectrically isolated layer 5. The gate connections G2 are shown in the Figure as is also the source region S2 although the latter region is not included in the section A—A. FIG. 2 also shows an electrically isolating protective layer 8 of silicon dioxide on the surface of the component region 4. The protective layer 8, which is not shown in FIG. 1, includes recesses 9 for the external electrical connections 6 and 7. According to one alternative, indicated in broken lines L1 in the Figure, the wafer-like gate regions G1 may extend from the surface of the component region 4 right down to the dielectrically isolating layer 2.

Figure 3:
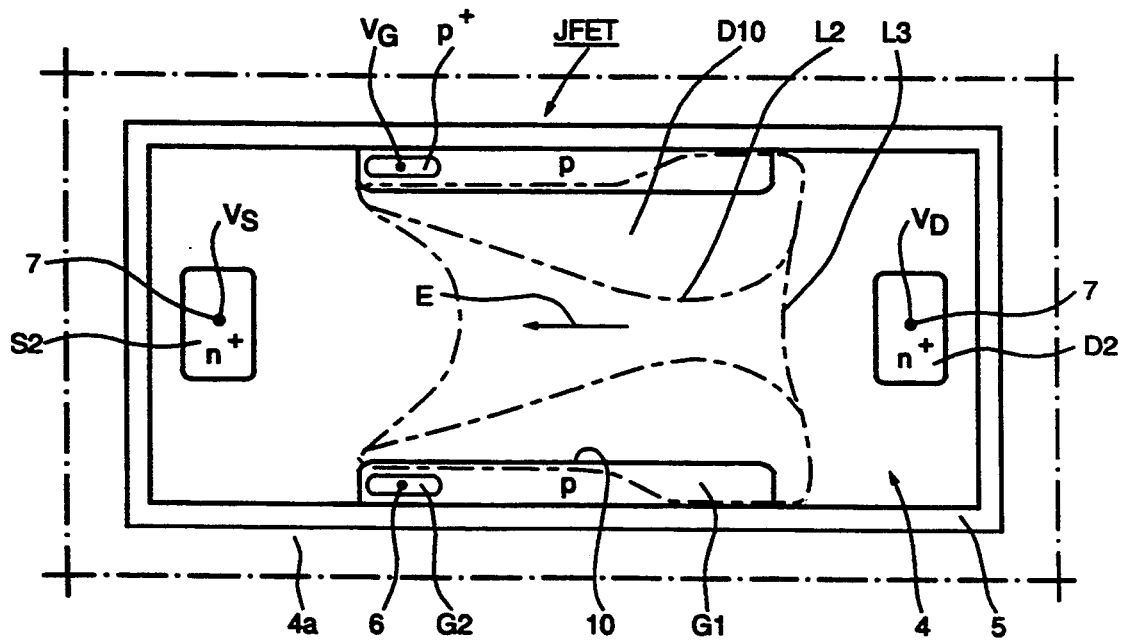
FIG. 3 shows the component in FIG. 1 from above.

FIG. 3 is a view from above of the field effect transistor JFET, including the component region 4, the isolating layer 5, the two gate regions G1 with gate connections G2, the source connection S2 and the drain connection D2. A gate voltage $V_G$ is applied to the external connection 6, and a source voltage $V_S$ and a drain voltage $V_D$ are applied to respective external connections 7. In a normal operational case, these voltages may, for instance, be $V_G = 0V$ (earth)

$V_S = 0V$ $V_D = 400V$

These voltages inversely bias the PN-junction 10 and a depletion region D10 is formed. This region extends in two lobes, as illustrated by chain lines L2 in the Figure. At the aforesaid voltage $V_D = 400$ V, the two lobes merge with one another to form a common depletion range, in accordance with chain lines L3. The electrical field strength E of an electric field in the depletion region can be maintained beneath a critical breakdown field strength $E_{CR} = 3.10^5$ V/cm for silicon, with a relatively high degree of surety. This can be achieved because the semiconductor material in the component region 4 is doped relatively weakly and can therefore be depleted readily of charge carriers. It should be noted that the gate regions G1 are also depleted partially, particularly in that part of the gate regions which lies proximal to the drain region D2.

Figure 4:
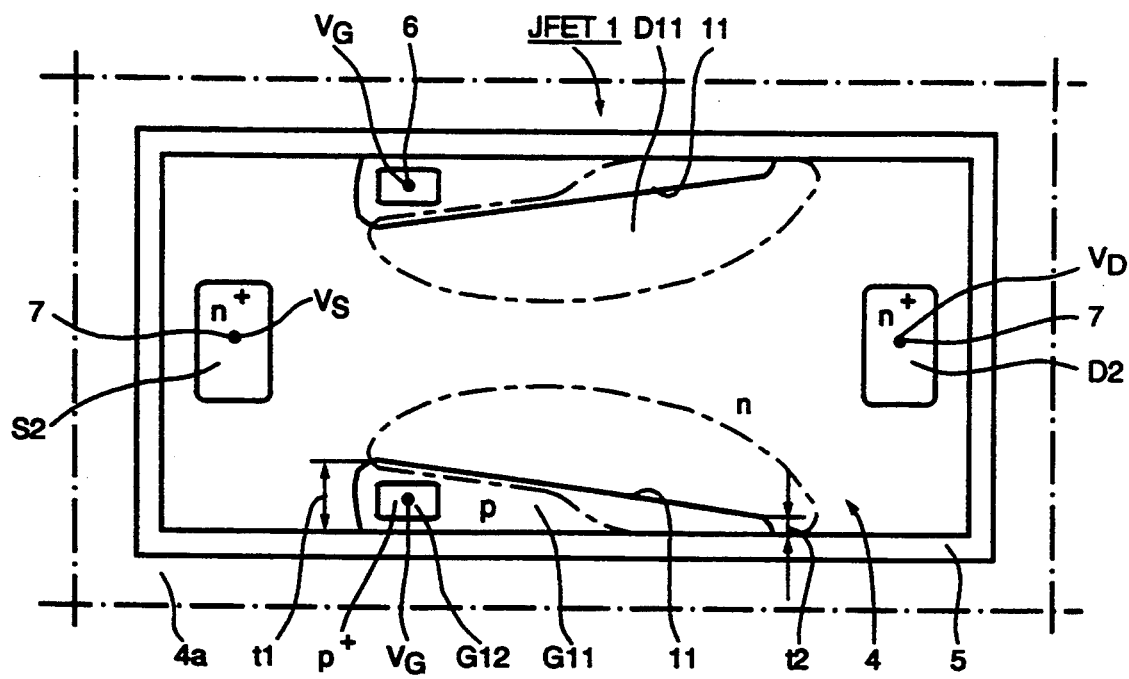
FIG. 4 illustrates from above an alternative embodiment of the component shown in FIG. 1.

An alternative embodiment of the invention is illustrated in FIG. 4, which shows a field effect transistor JFET1. Similar to the aforegoing, the component region 4 is delimited electrically by the dielectrically isolating layer 5. The source region S2 is placed in one end of the component region and the drain region D2 is placed in the other end of the component region. As described above the field effect transistor JFET1 includes two wafer-like gate regions G11 which extend down into the component region 4 from the surface of said region. Each of the gate regions G11 is placed midway along a respective long side of the component region 4 and the respective rear sides of said gate regions lie against the isolating layer 5. The gate regions G11 are relatively weakly positively p-doped and each has a heavily positively p+-doped connection region G12. Each of the gate regions G11 has a respective PN-junction 11 which faces towards the component region 4. Distinct from the gate regions G1, the gate regions G11 of this embodiment are relatively thick, having a thickness t1, at the end thereof which lies proximal to the source region S2, and is relatively thin, with a thickness t2, at the end thereof which lies proximal to the drain region D2. When the voltages $V_G$, $V_S$ and $V_D$ are applied to respective gate, source and drain connections 6 and 7, the PN-junction 11 is inversely biassed and a depletion region D11 is formed at the gate regions G11. Because the gate regions G11 of the field effect transistor JFET1 taper, the depletion region D11 has a different form to the depletion region D10 of the field effect transistor JFET of the FIG. 3 embodiment.

Figure 5:
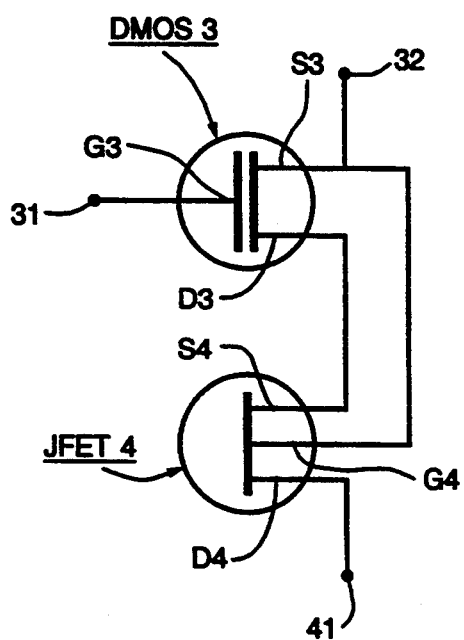
FIG. 5 illustrates a circuit containing two series-connected transistors.

The field effect transistors JFET and JFET1 in the dielectrically isolated component region 4 have been described in the aforegoing. According to the invention, it is also possible to arrange two or more series-connected semiconductor components in the component region 4. FIG. 5 illustrates schematically a first field effect transistor DMOS 3 which is connected in series to a second field effect transistor JFET4. The transistor DMOS3 has a gate region G3 which is connected to an external connection 31, and a source region S3 which is connected to an external electrical connection 32. The source region S3 is connected to a gate region G4 of the transistor JFET4, which in turn has a source region S4 which is connected to a drain region D3 of the transistor DMOS3. Finally the transistor JFET4 has a drain region D4 which is connected to an external electrical connection 41.

Figure 6:
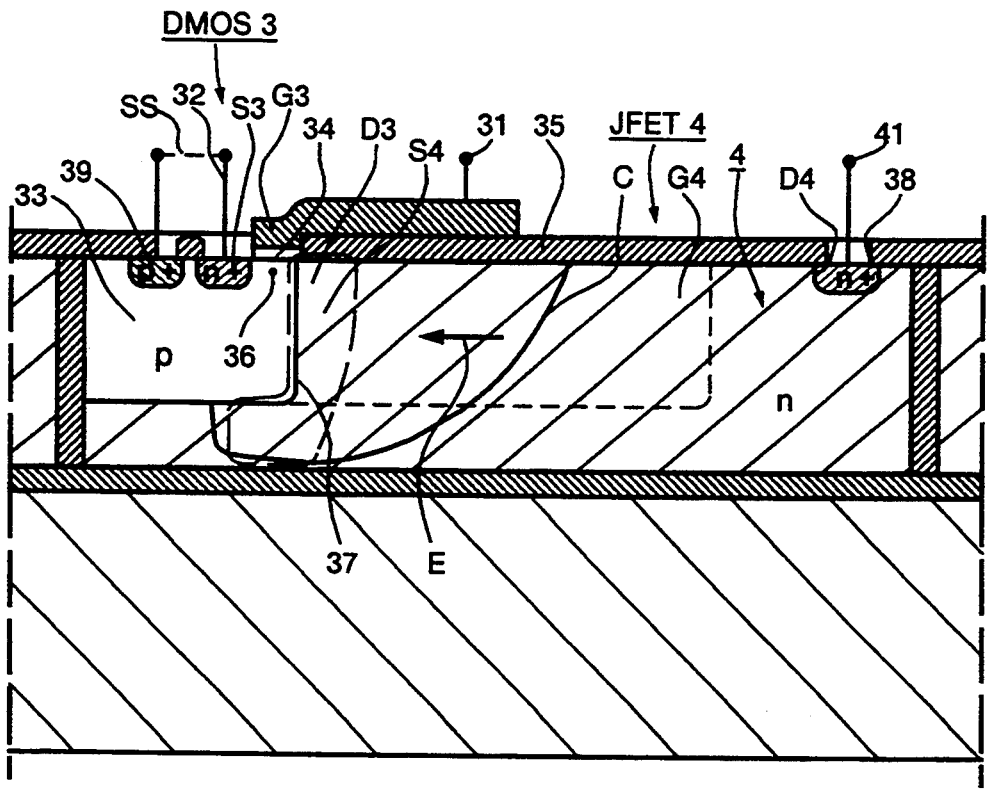
FIG. 6 is a cross-sectional view of the inventive transistors shown in FIG. 5.
Figure 7:
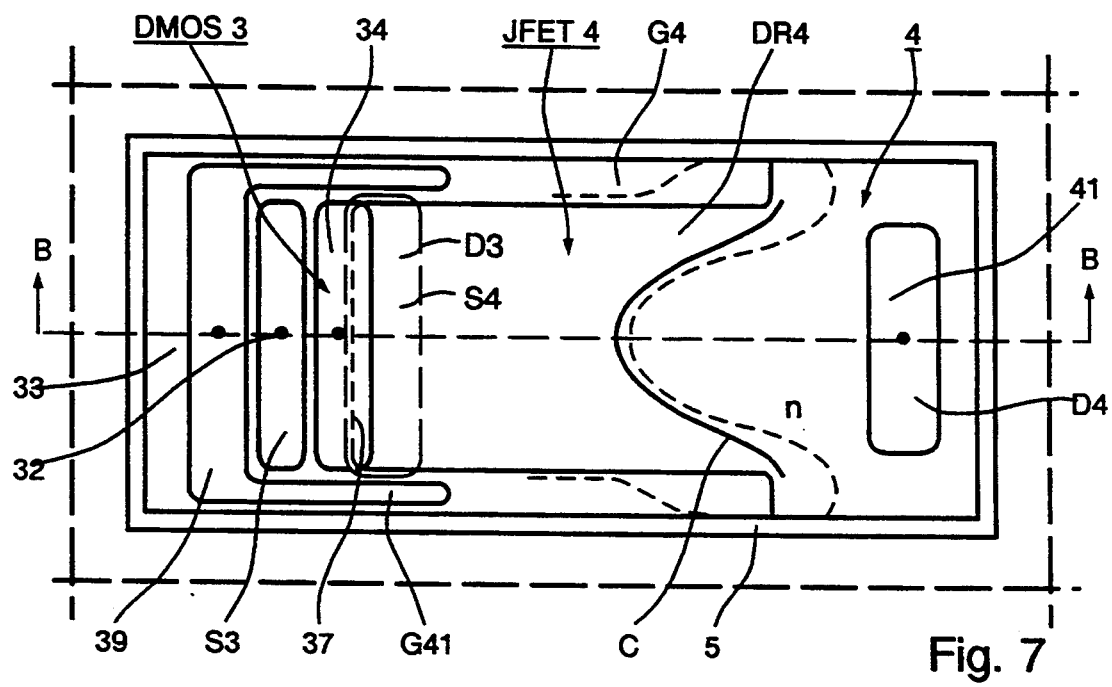
FIG. 7 illustrates the transistors in FIG. 6 from above.

The two field effect transistors DMOS3 and JFET4 formed in the component region 4 are illustrated in FIG. 6 and FIG. 7. FIG. 7 is a view taken from above and FIG. 6 is a cross-sectional view taken on the section line B—B in FIG. 7. In the FIG. 6 embodiment, the n-doped component region 4 is surrounded by the dielectrically isolating layer 5 and its upper surface is covered by a dielectrically isolating layer 35 of silicon dioxide and includes recesses 38 for electrical connections. The transistor DMOS3 has a relatively weakly, positively p-doped region 33 which extends down into the component region 4 from the surface of said region. The region 33 is located at one end of the component region 4 and has a PN-junction 37 at its surface bordering on the remainder of the component region. The source region S3 is comprised of a heavily n+-doped region at the surface of the region 33, and the external electrical connection 32 is connected to the source region S3. A heavily, positively p+-doped contact region 39 lies adjacent the source region S3 and forms an electrical contact for the region 33. In a normal operational case, the electrical contact region 39 is short-circuited with the source region S3, as illustrated by a broken line connection SS. A very thin layer 34 of silicon dioxide, a so-called gate oxide, lies on the surface of the component region on one side of the source region S3. The gate oxide 34 extends on the surface of the region 33 from the edge of the source region S3 over the PN-junction 37 and out slightly on the negatively doped part of the component region 4. The channel region 36 of the transistor DMOS3 is located beneath the gate oxide 34. The gate region G3 is comprised of a layer of doped, polycrystalline silicon which lies on top of the gate oxide 34 and the oxide layer 35 and is connected to the external electrical connection 31. The drain region D3 of the transistor DMOS3 is located in the component region 4 outside the channel region 36, in direct connection with the PN-junction 37. The drain region D3 also forms the source region S4 of the field effect transistor JFET4. The gate region of this field effect transistor is comprised of two wafer-like regions G4 of relatively weakly p-doped material, wherein each of said regions extends along a respective one of the two mutually opposing long sides of the component region 4. The wafer-like gate regions G4 correspond to the wafer-like gate regions G1 that have been described above in more detail with reference to FIG. 1. These wafer-like regions, which are shown in broken lines in FIG. 6, are connected at one end thereof to the weakly p-doped region 33. Each of the gate regions G4 has a respective heavily p+-doped gate connection region G41 which is connected to the heavily p+-doped region 39, as shown in FIG. 7. The drain region D4 of the transistor JFET4 is comprised of a heavily negatively n+-doped region at the other end of the component region 4, and the drain region D4 is connected to the electrical connection 41.

FIG. 7 illustrates the transistors DMOS3 and JFET4 from above, with the dielectrically isolating layer 35 and the gate region G3 removed so as to bring clearly into view other parts of the transistors. The region 39 is connected to the gate connection regions G41, which extend in the gate regions G4 and form electrical connections for these regions. The gate oxide 34 covers the PN-junction 37 and the channel region 36 of the transistor DMOS3. The common drain region D3 and the source region S4 extend at the PN-junction 37 between the gate regions G4. The Figure illustrates how these gate regions G4 are connected to the p-doped region 33 and lie against the isolating layer 5 along the two long sides of the component region 4. The drain region D4 of the transistor JFET4 is also shown.

The relatively weakly n-doped component region 4 between the wafer-like gate regions G4 can be depleted of charge carriers by connecting the connections of the transistors DMOS3 and JFET4 to external voltages. FIG. 7 indicates with a broken line a depleted region DR4 of the transistors DMOS3 and JFET4 which occurs when the source region S3 and the gate region G3 are both connected to ground potential 0 V and the drain region D4 is connected to a voltage of +100 V. As previously mentioned, the electrical contact region 39 is short-circuited with the source connection S3. A curve C discloses an electrical field strength $E=1.10^5$ V/cm which lies well beneath the critical field strength $E_{CR}=3.10^5$ V/cm of silicon at which there is a risk of current breakthrough in the material.

Figure 8:
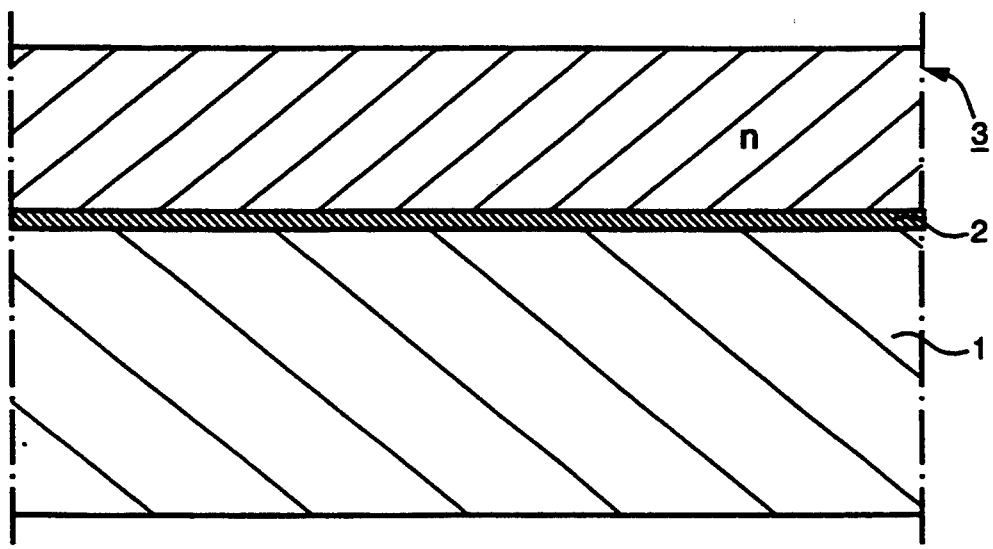
FIGS. 8-14 are cross-sectional views which illustrate individual method steps in the manufacture of the transistor shown in FIG. 1.
Figure 9:
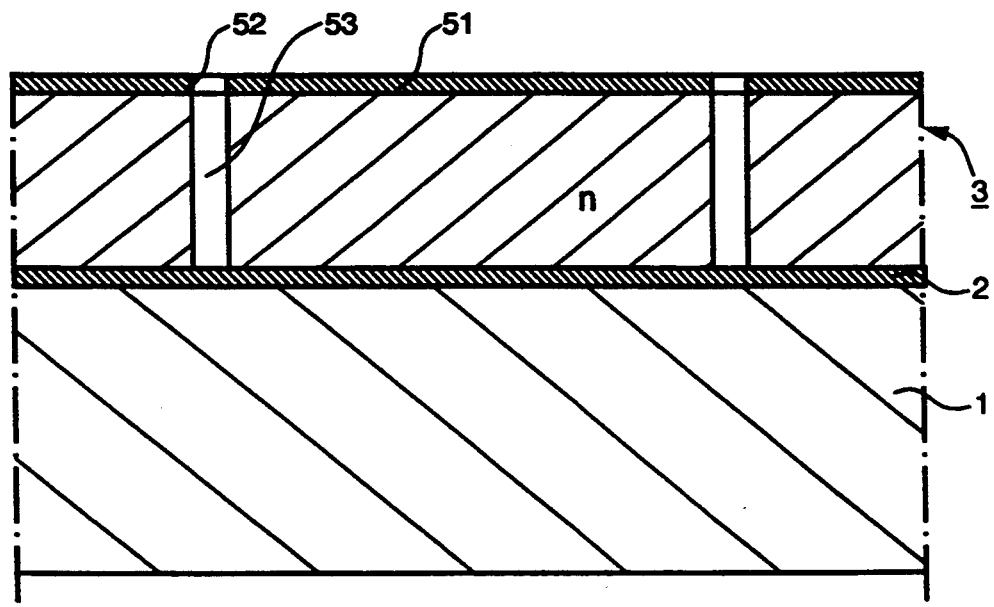
Figure 10:
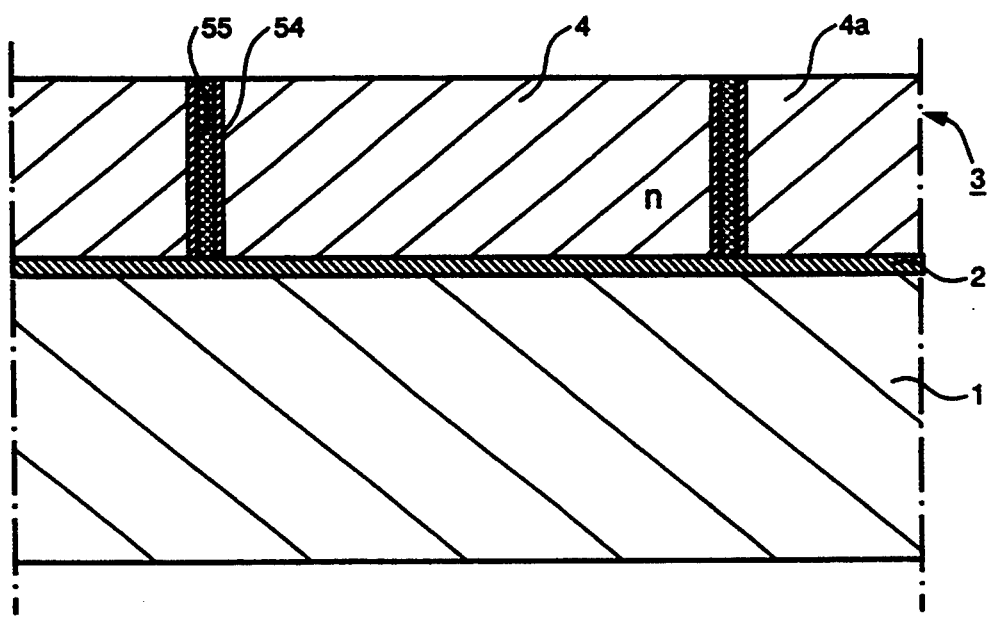
Figure 11:
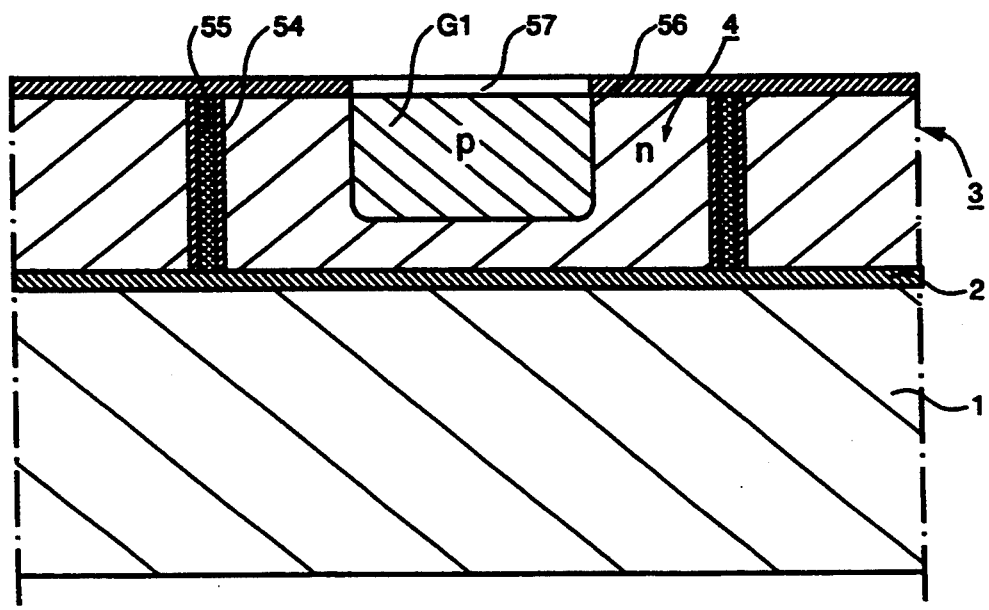
Figure 12:
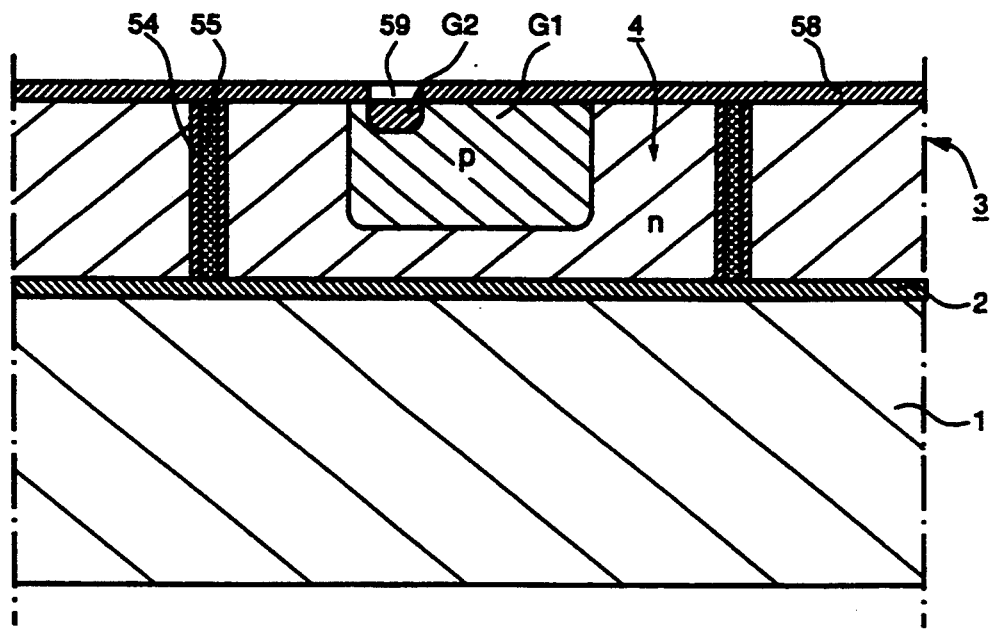
Figure 13:
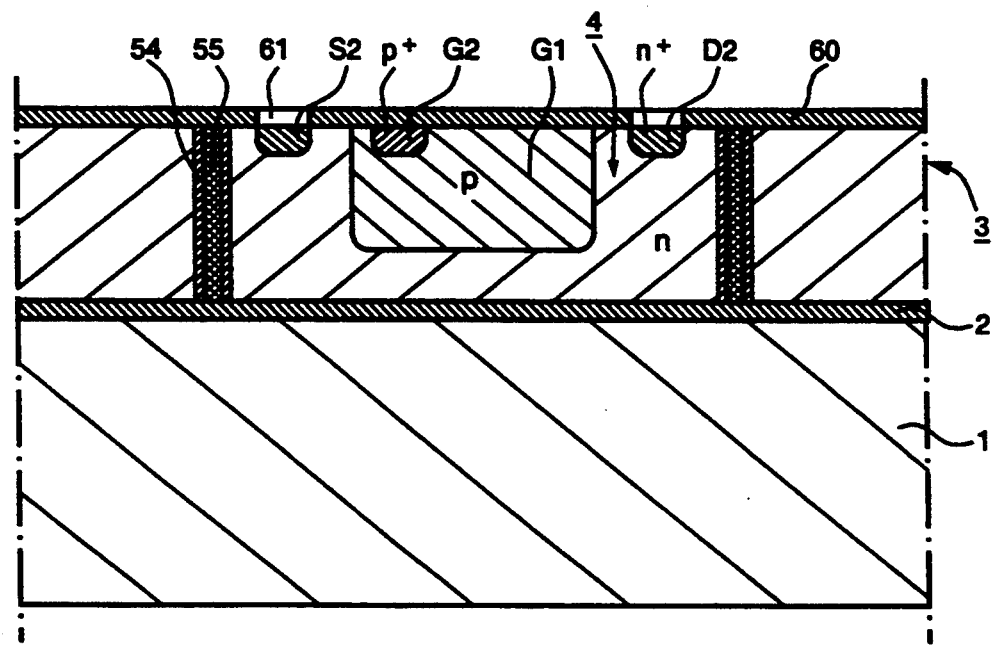
Figure 14:
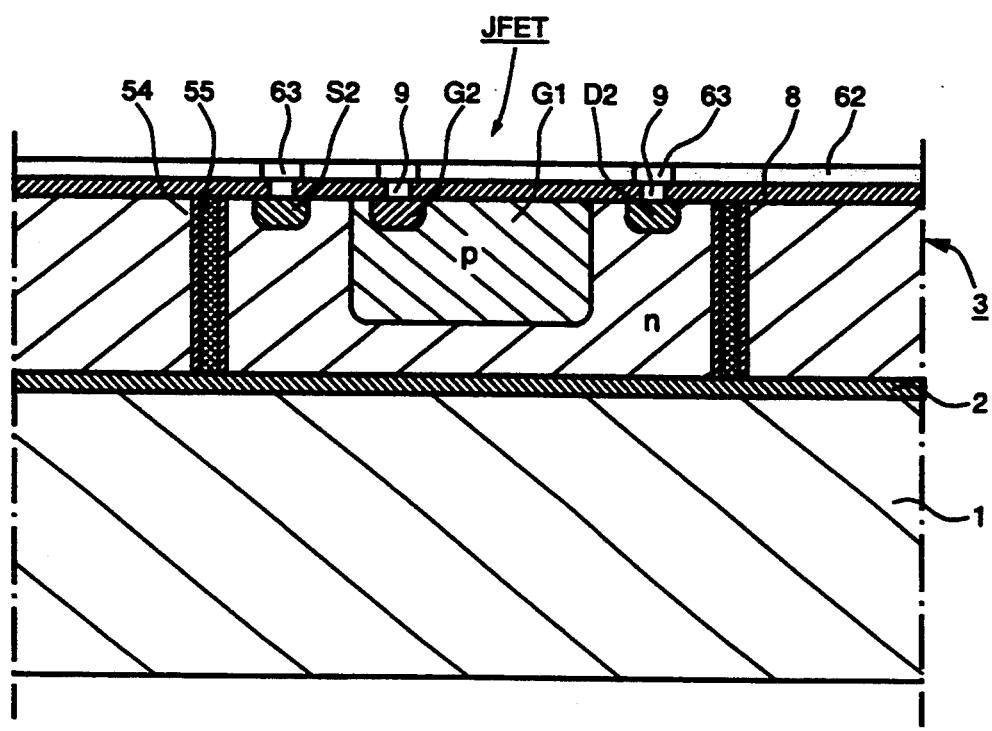

A method of manufacture of the aforesaid components will now be described by way of example with reference to FIGS. 8-14. The starting material used is a so-called bonded wafer comprising a silicon substrate 1, the isolating oxide layer 2 and the monocrystalline silicon wafer 3, as illustrated in FIG. 8. Such a bonded wafer can be produced, for instance, in the manner described in the aforecited European Patent Application No. A1-0,418,737, and is commercially available. According to FIG. 9, the upper surface of the wafer 3 is coated with a photoresist layer 51, which is exposed in a predetermined pattern and developed so as to form openings 52 in the layer 51. Deep trenches 53 are formed through these openings, by plasma etching down to the isolating layer 2 and the photoresist 51 is removed. According to FIG. 10, the side surfaces of the trenches 53 are oxidized to form silicon dioxide coatings 54, and the remaining parts of the trenches 53 are filled with polycrystalline silicon 55. The box-like component region 4 is delimited electrically in this way from the surrounding parts 4a of the monocrystalline wafer 3. The silicon dioxide layer 54 and the polycrystalline silicon 55 together form the dielectrically isolating layer 5, mentioned in the aforegoing with reference to FIG. 1. As illustrated in FIG. 11, the wafer 3 is coated with a new photoresist mask 56 having two openings 57, of which one is shown in the Figure. The openings 57 have a narrow, elongated shape and extend along the long sides of the component region 4 adjacent the dielectrically isolating layers. Doping with positive doping material is effected through these openings 57, so as to obtain the two wafer-like gate regions G1. The mask 57 is removed and a further photoresist mask 58 is applied, as illustrated in FIG. 12. The mask 58 has openings 59 through which heavy positive doping of the gate connections G2 is effected. The mask 58 is removed and a further photo-resist mask 60 is applied, as illustrated in FIG. 13. The mask 60 has openings 61 through which heavy negative doping of the source region S2 and the drain region D2 is effected. Subsequent hereto, the mask 60 is removed and the surface of the monocrystalline wafer 3 is oxidized to form the isolating silicon-dioxide layer 8, as illustrated in FIG. 14. This layer 8 is coated with a photoresist mask 62 which has openings 63 through which the connection openings 9 are etched in the layer 8. The mask 62 is removed and the component is provided with the aforesaid external connections 6 and a protective layer. The connections and the protective layer are not shown in the Figure.

For the sake of simplicity, the gate region G1, the source region S2 and the drain region D2 have been shown in the same cross-sectional view in conjunction with the description of the method of manufacture, despite these regions being laterally displaced in relation to one another in reality. It should be carefully noted that all of the different stages of manufacture, for instance oxidation, application of masks, diffusion of doping materials and etching, are well known to the person skilled in this art.

The novel inventive features of the method lie, for instance, in the possibility of producing the field effect transistor JFET in the isolated component region 4 in a simple fashion, in that the configuration of this transistor is determined by simple selection of the configuration of the three masks 56, 58 and 60, and in that simple modifications of the manufacturing method, for instance modifications to the configuration of the masks, enables a large number of different types of component to be produced.

It is mentioned in the introduction that large field strengths can also occur in components intended for calculating or computing circuits which are connected to voltages in the order of 3 to 5 volts. These components are very rapid, contain high concentrations of doping substances and are small in size. For instance, the thickness of these components, corresponding to the distance A1 in FIG. 1, may be only about 0.5 μm. The invention can also-be applied to these components, which have a high connecting voltage in relation to their size. It can be mentioned that in the case of these thin components, the aforesaid separation layer 5 can be replaced with a layer produced by so-called local oxidation (LOCOS), which is a relatively simple isolation method.

The invention has been exemplified with reference to silicon components, although it will be understood that other semiconductor materials, such as germanium and gallium arsenide can be used equally as well. The doping types, p and n, referred to in the examples can be reversed without digressing from the invention.

The inventive components provide several advantages in addition to their voltage durability. By applying the resurf technique in the aforedescribed manner, the applied voltage is distributed over a large part of the component. Consequently, the component need only occupy a relatively small surface area of the substrate, as described above. In addition, the components may advantageously be made thin, which enables the components to be isolated laterally with the illustrated dielectrical separation layers 5 and 25 respectively. This results in a further reduction in the space required on the substrate. When practicing the invention, the requisite surface area of a semiconductor substrate which is to carry a specific number of components can be at least halved in comparison with earlier known techniques. This is particularly beneficial in the case of, for instance, subscriber line circuits in a telephone system in which each subscriber has its own line circuit. Another advantage afforded by the invention is that the components can be produced easily, since they are formed in a finished monocrystalline semiconductor layer and since their form is determined by selection of photoresist masks.

I claim:

1. A dielectrically isolated semiconductor device, which has charge carrier depleted regions of reduced electrical field strength, comprising:

a semiconductor body;

a component region in the semiconductor body having an upper surface and two mutually opposing sides;

a dielectrically isolating layer that delimits the component region, including the two mutually opposing sides, from the semiconductor body;

a sunken region in the component region, the sunken region extending from the upper surface of the component region down thereinto and including two mutually opposing wafer-like subregions which, at the two mutually opposing sides of the component region, extend along the dielectrically isolating layer from the upper surface of the component region down into the component region, the mutually opposing subregions having relatively low concentrations of doping material;

a PN-junction at a delimiting surface of the sunken region, which delimiting surface delimits the sunken region from a remaining part of the component region, the remaining part having a type of doping that is opposite to a type of doping of the sunken region; and a semiconductor component in the component region having at least one electrical connection region in the sunken region and at least one electrical connection region in the remaining part of the component region;

wherein the component region has a relatively low concentration of doping material at least in a region between the mutually opposing subregions, and when electric voltages are applied to the electrical connection regions, the regions of reduced electrical field strength are depleted of charge carriers, one of the charge carder depleted regions extending in a region between the mutually opposing subregions and into the subregions so that an electrical field strength in the one charge carrier depleted region is less than a breakdown field strength of the semiconductor material.

2. The device of claim 1, wherein each mutually opposing wafer-like subregion is thicker at one end than at its other end.

3. The device of claim 1, wherein each mutually opposing wafer-like subregion includes a heavily doped electrical connection region.

4. The device of claim 1, wherein the mutually opposing wafer-like subregions include a gate of a field effect transistor; and the electrical connection regions include heavily doped regions at both ends of the component region, the heavily doped regions having doping types that are the same as the doping type of the remaining part of the component region and a first one of the heavily doped regions forming a source region of the field effect transistor and a second one of the heavily doped regions forming a drain region of the field effect transistor.

5. The device of claim 1, further comprising a first field effect transistor which is series-connected with a second field effect transistor;

wherein the sunken region includes a relatively weakly doped connecting region at one end of the component region, and both mutually opposing wafer-like subregions are connected at ends thereof to the weakly doped connecting region that has a heavily doped contact region having a doping type that is the same as the doping type of the sunken region;

the first field effect transistor has a strongly doped source region that has a doping type that is the same as the doping type of the remaining part of the component region, the source region being located in the connecting region, and a channel region that is located in the connecting region at the surface of the connecting region between the source region and the remaining part of the component region and that has mounted on a surface thereof an electrically isolating gate oxide which carries an electrically conductive gate region;

the second field effect transistor has a heavily doped drain region at the other end of the component region and having the same doping type as the remaining part of the component region, and a gate which includes the mutually opposing wafer-like subregions, each of the subregions having a respective gate connection region that is connected to the electrical contact region of the connecting region; and a region in the remaining part of the component region between the wafer-like subregions adjacent the connecting region includes the drain region of the first field effect transistor and the source region of the second field effect transistor.

* * * * *